(12) United States Patent
Wu et al.

(10) Patent No.: US 10,446,683 B2
(45) Date of Patent: Oct. 15, 2019

(54) METHODS, APPARATUS AND SYSTEM FOR FORMING SIGMA SHAPED SOURCE/DRAIN LATTICE

(71) Applicant: GLOBALFOUNDRIES INC., Grand Cayman (KY)

(72) Inventors: Xusheng Wu, Ballston Lake, NY (US); Hong Yu, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 13 days.

(21) Appl. No.: 15/702,278

(22) Filed: Sep. 12, 2017

(65) Prior Publication Data

US 2019/0081175 A1 Mar. 14, 2019

(51) Int. Cl.
*H01L 29/78* (2006.01)
*H01L 29/66* (2006.01)

(52) U.S. Cl.
CPC ...... *H01L 29/7848* (2013.01); *H01L 29/6656* (2013.01); *H01L 29/66553* (2013.01); *H01L 29/66795* (2013.01); *H01L 29/785* (2013.01)

(58) Field of Classification Search
CPC ............. H01L 29/66795; H01L 29/785; H01L 29/7851; H01L 29/0649
See application file for complete search history.

(56) References Cited

U.S. PATENT DOCUMENTS

| | | | |
|---|---|---|---|
| 7,030,435 B2 | 4/2006 | Gnadinger | |
| 7,351,993 B2 | 4/2008 | Atanackovic | |
| 7,432,550 B2 | 10/2008 | Bojarczuk et al. | |
| 8,546,857 B1 * | 10/2013 | Wang | H01L 29/66636 257/288 |
| 9,601,594 B2 * | 3/2017 | Wu | H01L 29/66575 |
| 9,627,511 B1 * | 4/2017 | Cheng | H01L 29/66553 |
| 9,876,088 B1 * | 1/2018 | Van Dal | H01L 29/42392 |
| 2013/0181208 A1 * | 7/2013 | Guo | H01L 31/125 257/40 |
| 2018/0151739 A1 * | 5/2018 | Liang | H01L 29/7853 |

OTHER PUBLICATIONS

H.J. Osten et al.; "High-k dielectrics with Ultra-low leakage current vased on praseodymium oxide;" pp. 653-656, IEDM 2000.
J.P. Liu, et al; "Epitaxial growth of Pr2O3 on Si. 111, and the observation of a hexagonal to cubic phase transition during postgrowth N2 annealing;" pp. 671-673, Appl. Phys. Lett., vol. 79, No. 5, 2001.

\* cited by examiner

*Primary Examiner* — Zandra V Smith
*Assistant Examiner* — John M Parker
(74) *Attorney, Agent, or Firm* — Williams Morgan, P.C.

(57) ABSTRACT

At least one method, apparatus and system disclosed herein involves forming a sigma shaped source/drain lattice. A fin is formed on a semiconductor substrate. A gate region is formed over the fin. In a source region and a drain region adjacent bottom portions of the fin, a first recess cavity is formed in the source region, and a second recess cavity is formed in the drain region. The first and second recess cavities comprise sidewalls formed in an angle relative to a vertical axis. Portions of the first and second recess cavities extend below the fin. In the first recess cavity, a first rare earth oxide layer is formed, and in the second recess cavity, a second rare earth oxide layer is formed.

15 Claims, 8 Drawing Sheets

Cross-sectional view of Cut Line 620 of Fig. 6

Cross-sectional view of Cut Line 1070 of Fig. 10

METHODS, APPARATUS AND SYSTEM FOR FORMING SIGMA SHAPED SOURCE/DRAIN LATTICE

BACKGROUND OF THE INVENTION

Field of the Invention

Generally, the present disclosure relates to the manufacture of sophisticated semiconductor devices, and more specifically, to forming a sigma shaped lattice under source/drain regions.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

Figure 1:
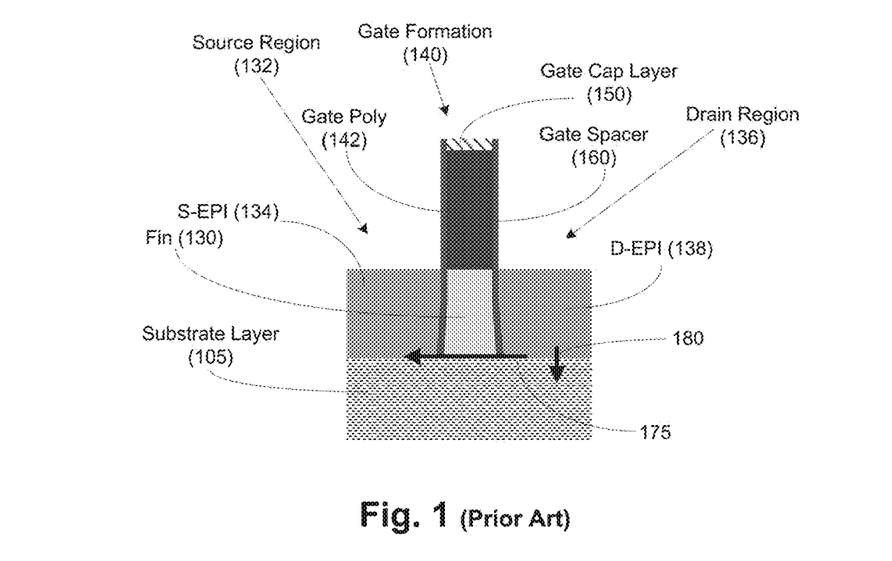
FIG. 1 illustrates a stylized cross-sectional depiction of a state-of-the-art finFET device.

In modern finFET devices, a current leakage problem between the source and drain regions may occur. FIG. 1 illustrates a stylized depiction of a state-of-the-art finFET device.

A device 100 comprises a substrate layer 105 (e.g., silicon substrate, silicon germanium substrate, etc.). Using one of various techniques, a fin 130 is formed on the substrate layer 105. Each of the fins 130 may be part of a fin structure, which may include the fin 130 and a plurality of layers of materials that may be deposited on the fins 130.

A gate formation 140 may be formed above the fin 130. The gate formation includes a gate poly layer 142, and a gate cap layer 150 is formed over the gate poly layer 142. The gate formation 140 also includes a gate spacer 160.

Adjacent the fin 130 below the gate formation 140 is a source region 132 and a drain region 136. A source EPI feature 134 may be formed in the source region 132, and a drain EPI feature 138 may be formed in the drain region 136.

In most cases, a so-called "punch-through" effect may occur at the bottom of the fin 130. The punch-through effect refers to a current flow between the source and drain regions 132, 136, stylistically depicted by the arrow 175. This isolation problem between the source and drain regions 132, 136 can cause various leakage current problems.

In typical cases, the bottom portion of the fin 130 may be wider that the top portion of the fin 130. This thicker fin width may cause a current leakage path to develop in the OFF-state of the device 100. Further, a substrate current leakage path may develop, as denoted by the arrow 180. This path may cause current leakage between the source/drain region and the substrate. The current leakage problem surrounding the source and drain regions 132, 136 may cause source/drain (S/D) junction leakage in the ON state, causing performance degradation of the device 100. These current leakage issues may cause various problems, including gate control problems.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a sigma shaped source/drain lattice. A fin is formed on a semiconductor substrate. A gate region is formed over the fin. In a source region and a drain region adjacent bottom portions of the fin, a first recess cavity is formed in the source region, and a second recess cavity is formed in the drain region. The first and second recess cavities comprise sidewalls formed in an angle relative to a vertical axis. Portions of the first and second recess cavities extend below the fin. In the first recess cavity, a first rare earth oxide layer is formed, and in the second recess cavity, a second rare earth oxide layer is formed.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for a source/drain (S/D) configuration that may provide decreased punch-through current leakage effect at the bottom of a fin in a finFET device during an OFF state of the finFET device. Further embodiments herein may provide for increased gate control and a reduction in S/D junction leakage in the ON state of the finFET device.

Embodiments herein provide for an exemplary sigma shaped lattice below a fin adjacent a source and/or a drain region. In some embodiments, the sigma shaped lattice may be formed using a rare earth oxide material. The sigma shaped lattice of embodiments herein may provide for improved source/drain isolation, thereby decreasing current flow, or substantially negligible current leakage between the S/D regions, at the bottom of a fin adjacent the S/D regions. The sigma shaped lattice of embodiments herein may also provide for improved S/D isolation to the substrate, thereby providing decreased or substantially negligible junction leakage between the S/D regions and the substrate.

Figure 2:
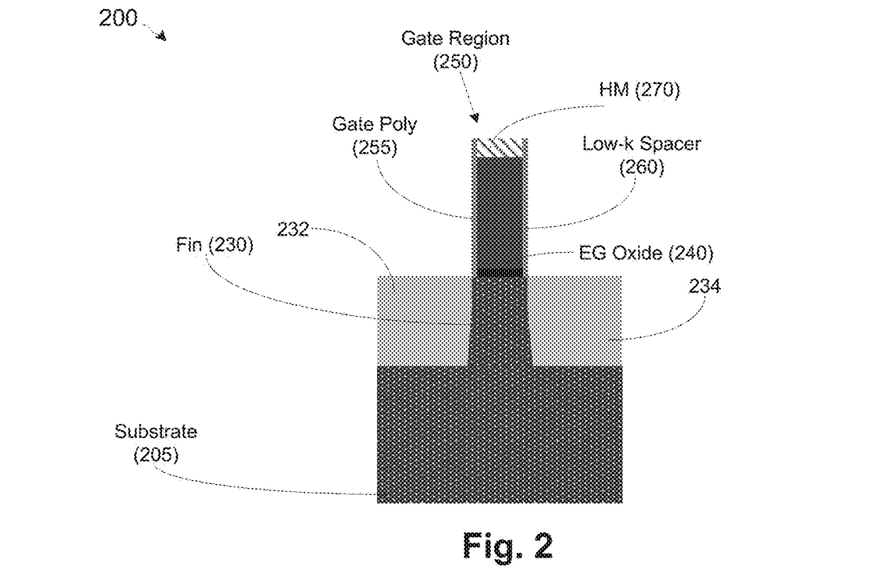
FIG. 2 illustrates a stylized depiction of a cross-section view of a finFET device, with respect to processing a fin and a gate region, in accordance with embodiments herein.

Turning now to FIG. 2, a stylized depiction of a cross-section view of a finFET device, with respect to processing a fin and a gate region, in accordance with embodiments herein is illustrated. Using various techniques known to those skilled in the art, an integrated circuit device 200 comprising a fin 230, is formed on a substrate 205, are formed. In one embodiment, the fin 230 is a PFET fin, while in other embodiments, the fin 230 is an NFET fin.

FIG. 2 also shows a drain region prior to recess (234) and a source region prior to recess (232). These regions 232, 234 are removed at a later time during processing and may be replaced by an epitaxial growth after forming rare earth oxide sigma shaped layers, as described below.

A gate region 250 may be formed surrounding the fin 230. The gate region may include an EG oxide layer 240, which may be formed surrounding the fin 230. A gate poly region 255 is formed above the EG oxide layer 240. A nitride hard mask (HM) layer 270 (e.g., $SiN_2$) may be formed above gate poly region 255. Further, a low-k dielectric spacer 260 may be formed about the gate region 250.

Figure 3:
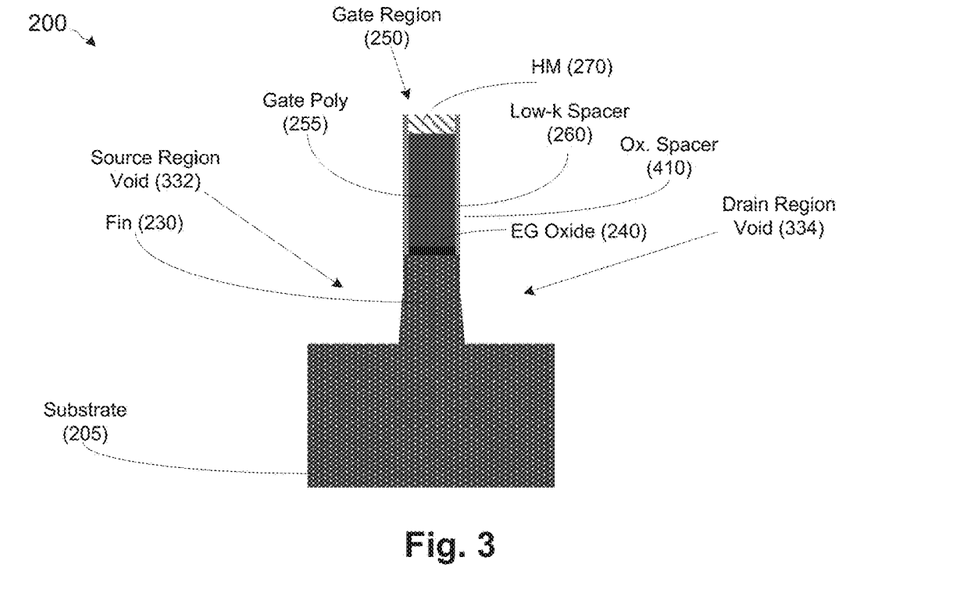
FIG. 3 illustrates a stylized depiction of a cross-section view of a finFET device, with respect to removing a portion of the S/D regions, in accordance with embodiments herein.

Turning now to FIG. 3, a stylized depiction of a cross-section view of a finFET device, with respect to removing a portion of the S/D regions, in accordance with embodiments herein is illustrated. At least portions of the source and drain regions prior to recess (232, 234) (FIG. 2) are removed for forming EPI features. In one embodiment, a dry etch process may be performed to etch away silicon material to form a source region void 332 and a drain region void 334. EPI formations may be formed in these void regions 332, 334 later.

Figure 4:
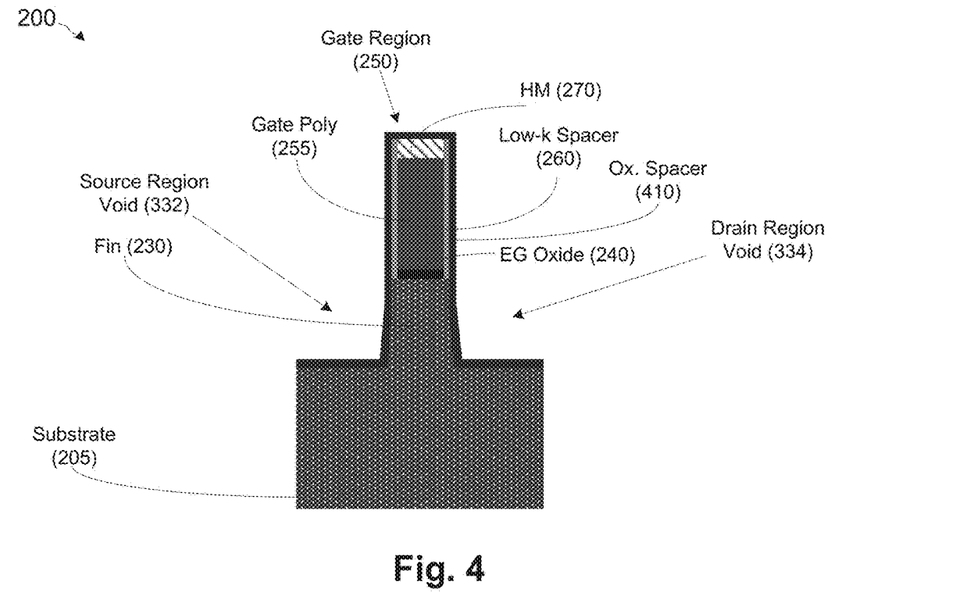
FIG. 4 illustrates a stylized depiction of a cross-section view of a finFET device, with respect to a spacer deposition process, in accordance with embodiments herein.

Turning now to FIG. 4, a stylized depiction of a cross-section view of a finFET device, with respect to a spacer deposition process, in accordance with embodiments herein is illustrated. Upon forming the source and drain void regions 332, 334, a spacer deposition process may be performed to form the spacer 410. In one embodiment, the spacer 410 may comprise an oxide material, such as $SiO_2$.

Figure 5:
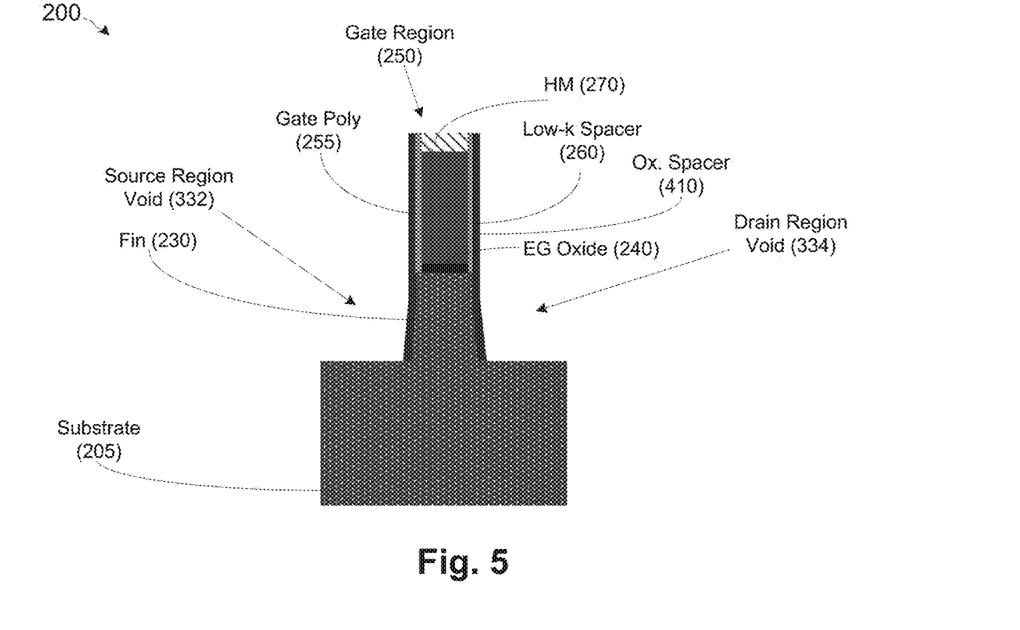
FIG. 5 illustrates a stylized depiction of a cross-section view of a finFET device, with respect to a spacer etch process, in accordance with embodiments herein.

Turning now to FIG. 5, a stylized depiction of a cross-section view of a finFET device, with respect to a spacer etch process, in accordance with embodiments herein is illustrated. After depositing a relatively thin layer of spacer material, forming the spacer 410, a selective etch process may be performed. In one embodiment, a selective oxide etch process is performed. The etch process is performed to selectively remove the horizontal portions of the spacer 410 such that only the side portions about the gate region 250, and about the source and drain void regions 332, 334 remain, as stylistically depicted in FIG. 5.

Figure 6:
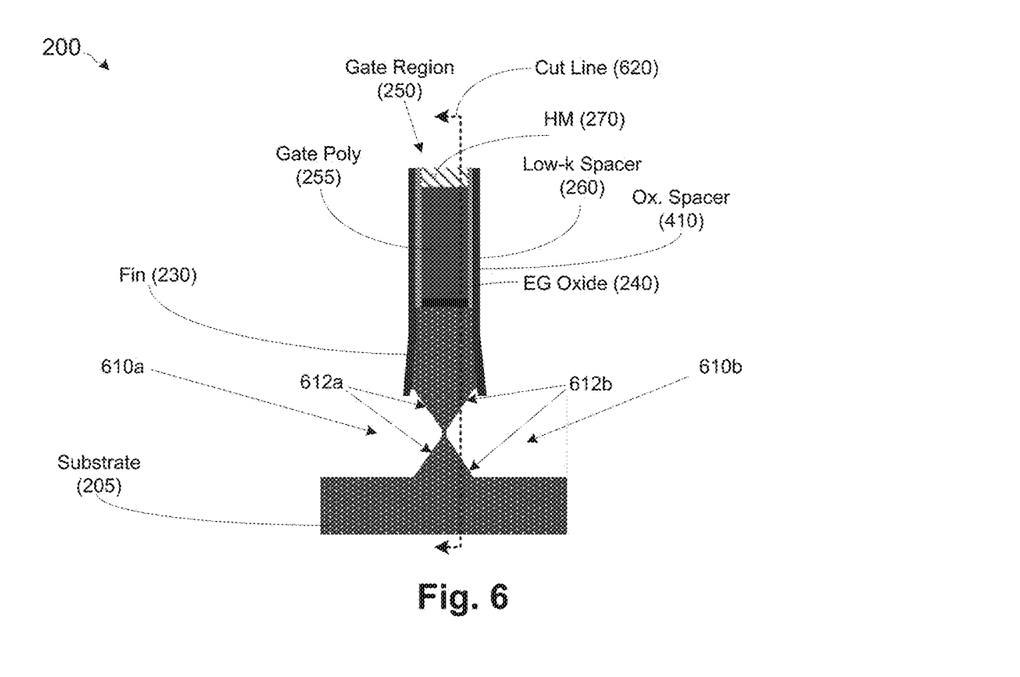
FIG. 6 illustrates a stylized depiction of a cross-section view of a finFET device, with respect to a sigma shaped recess, in accordance with embodiments herein.

Turning how to FIG. 6, a stylized depiction of a cross-section view of a finFET device, with respect to a sigma shaped recess, in accordance with embodiments herein is illustrated. A plurality of recess regions may be formed below the fin 230. In one embodiment, a first recess region 610a and a second recess region 610b may be formed. The recess region 610a may comprise a plurality of inclined sidewalls 612a, wherein the recess region 610b may comprise a plurality of inclined sidewalls 612b. The sidewalls 612a and 612b may be inclined relative to a vertical axis (i.e., y-axis) along the length of the fin 230. In some embodiment, the recess regions 610a, 610b may form "sigma cavities."

Sigma cavities may be formed using an etch process that is plane sensitive, to create the shape of recess regions 610a, 610b in the substrate 205, and may resemble roughly the shape of a sigma. The recess regions 610a, 610b, e.g., sigma cavities, include inclined sidewalls 612a, 612b that border the recess regions 610a, 610b. The sidewalls 612a, 612b may substantially correspond to specific crystal planes.

In some embodiments, a tetramethylammonium gydroxide (TMAH) wet etch process may be performed to recess regions 610a, 610b. The TMAH etch on silicon may provide a sigma shape based on crystal Si-(111) etch. In other embodiments, an ammonia-based etch process may be performed. The etch process on Si-(111) may provide higher selectively in etching for providing desired sigma shaped recesses. Those skilled in the art would appreciate that other type of cavities may also be implemented in alternatives embodiments herein.

Figure 7:
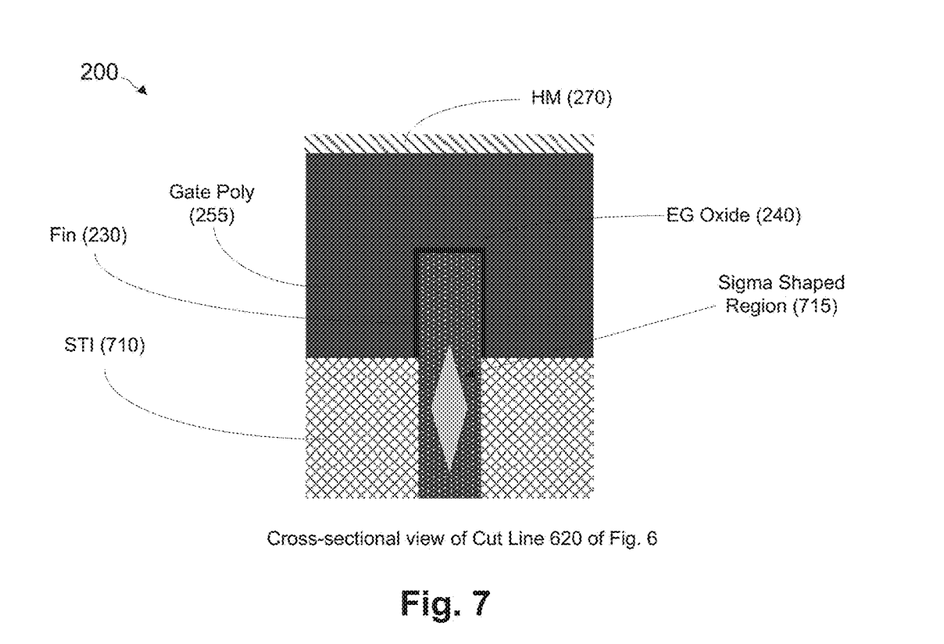
FIG. 7 illustrates a stylized depiction of a cross-section view that is perpendicular to the cross-sectional view of FIG. 6, in accordance with embodiments herein.

Turning how to FIG. 7, a stylized depiction of a cross-section view that is perpendicular to the cross-sectional view of FIG. 6, in accordance with embodiments herein is illustrated. The cross-sectional depiction of FIG. 7 is a view relative to the cut-line 620 of FIG. 6. FIG. 7 depicts the fin 230 surrounded by the EG oxide layer 240. The gate poly region 255 surrounds the EG oxide layer 240 in the manner depicted in FIG. 7. FIG. 7 also displays a sigma shaped region 715, which is a side view of the recess region 610b of FIG. 6. The sigma region 715 is surrounded on both sides by a shallow-trench isolation (STI) region 710.

Figure 8:
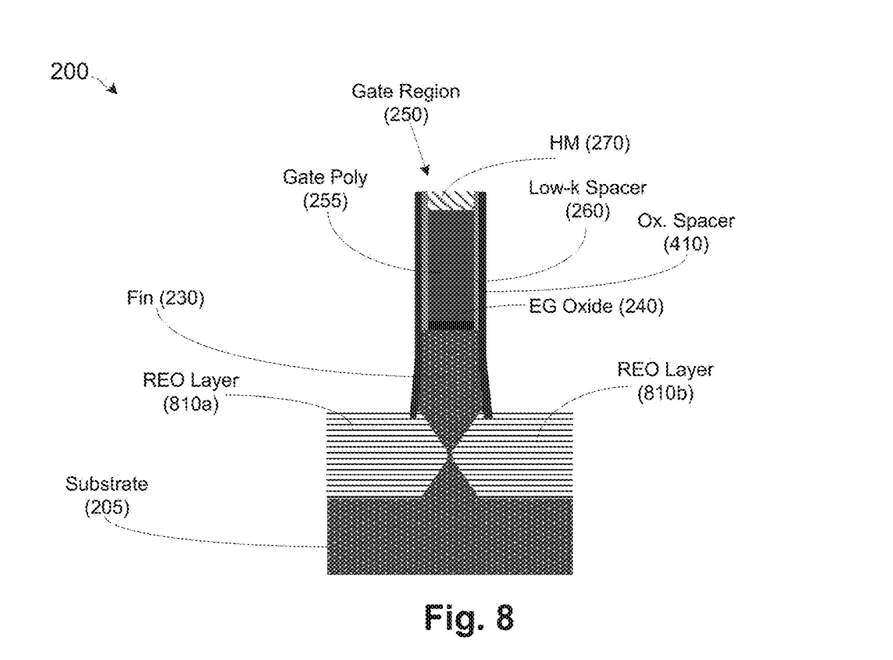
FIG. 8 illustrates a stylized depiction of a cross-section view with respect to an REO oxide deposition process, in accordance with embodiments herein.

Turning now to FIG. 8, a stylized depiction of a cross-section view with respect to an REO oxide deposition process, in accordance with embodiments herein is illustrated. Within the recess regions 610a, 610b, rare earth oxide (REO) features may be formed by depositing a rare earth oxide material. Examples of such rare earth oxide material may include, but are not limited to, gadolinium oxide, erbium oxide, lanthanum oxide ($La_2O_3$), gadolinium-doped aluminum-zinc oxide (Gd-AZO), Yttrium oxide (Y2O3), Cerium oxide ($CeO_2$), praseodymium oxide ($Pr_6O_{11}$), neodymium oxide ($Nd_2O_3$), samarium oxide ($Sm_2O_3$), europium oxide ($Eu_2O_3$), gadolinium oxide ($Gd_2O_3$), terbium oxide ($Tb_4O_7$), dysprosium oxide ($Dy_2O_3$), holmium oxide ($Ho_2O_3$), erbium oxide ($Er_2O_3$), ytterbium oxide ($Yb_2O_3$), lutetium oxide ($Lu_2O_3$), scandium oxide ($Sc_2O_3$), thulium oxide ($Tm_2O_3$), or the like. An REO oxide feature 810a may be formed in the recess region 610a and another REO oxide feature 810b may be formed in the recess region 620b.

The REO oxide features 810a, 810b provides isolation at the bottom of the fin 230. The REO oxide features 810a, 810b provides isolation between the gate region 250 and the substrate, as well as the source/drain regions to the substrate. The REO oxide features 810a, 810b may be formed to a thickness sufficient to reduce or substantially prevent leakage current flow from the S/D regions to the substrate 205 during an ON state of the device 200. The REO features 810a, 810b may extend sufficiently within the bottom area of the fin 230 to reduce or substantially eliminate current leakage between the source and drain regions. In some embodiments, the thickness of the REO features 810a, 810b may be in the range of about 5 nm to about 100 nm thick.

Figure 9:
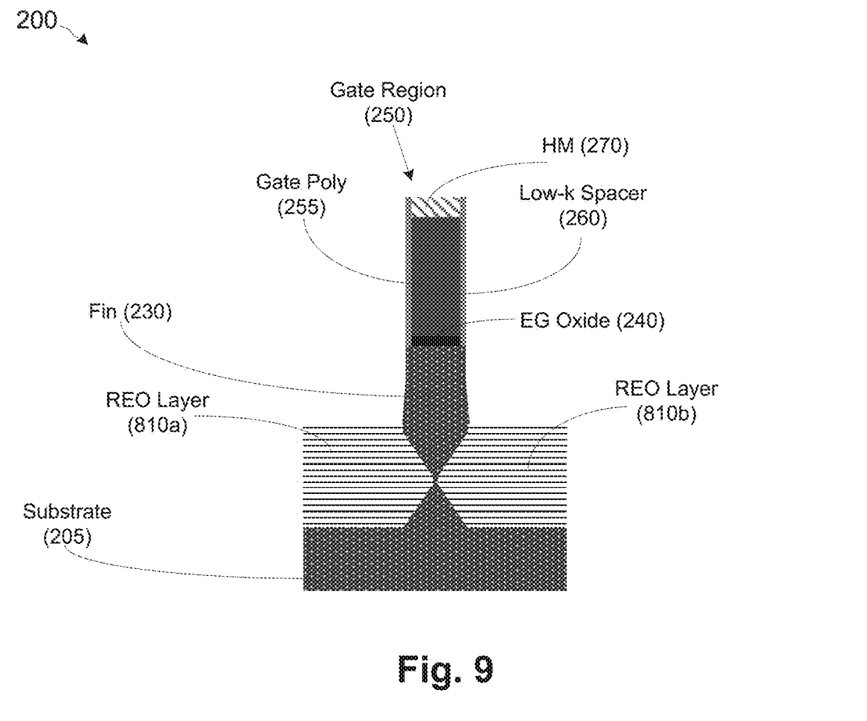
FIG. 9 illustrates a stylized depiction of a cross-section view with respect to a sacrificial spacer removal process, in accordance with embodiments herein.

Turning now to FIG. 9, a stylized depiction of a cross-section view with respect to a sacrificial spacer removal process, in accordance with embodiments herein is illustrated. The spacer 410 is removed after forming the EPI features 810a, 810b. In one embodiment, an oxide spacer etch process may be performed to selectively remove the sacrificial spacer 410. This leaves the top portion of the REO oxide feature 810a, 810b exposed, as shown in FIG. 9.

Figure 10:
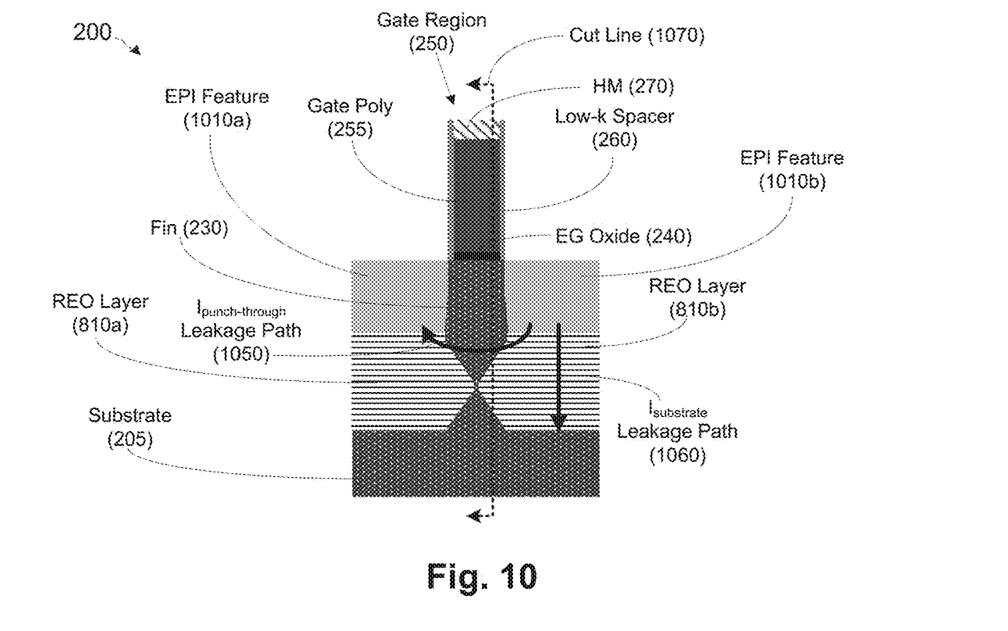
FIG. 10 illustrates a stylized depiction of a cross-section view with respect to an EPI feature spacer removal process, in accordance with embodiments herein.

Turning now to FIG. 10, a stylized depiction of a cross-section view with respect to an EPI feature spacer removal process, in accordance with embodiments herein is illustrated. EPI features 1010a, 1010b may be formed on the REO oxide feature 810a, 810b. The EPI features 1010a, 1010b may be formed on the REO oxide material and/or on silicon material. That is, the EPI features 1010a, 1010b may be grown from the sides (i.e., from the fin 230) and the bottom (i.e., from the REO features 810a, 810b.

Those skilled in the art having benefit of the present disclosure would appreciate that a plurality of process steps are performed to form the EPI features 1010a, 1010b. In some embodiments, the EPI feature 350 may be grown to a size in the range of about 5 nm to about 70 nm (lateral EPI width). The EPI feature 350 may be deposited using an ultra-high vacuum chemical vapor deposition process (CVD) process (UHVCVD) or/and standard CVD process. The precursors for the EPI features 1010a, 1010b may comprise gases comprising silicon (e.g., $SiH_4$, $Si_2H_2Cl_2$, $Si_2H_6$, $Si_3H_8$) and/or gases comprising germanium (e.g., $GeH_4$). The partial pressures of these gases may be varied to adjust the atomic ratio of germanium to silicon. In one embodiment, the EPI features 1010a, 1010b may be grown at a temperature in the range of about 350° C. to 850° C. with source gas.

An arrow with the reference "$I_{punch-through}$" 1050, which depicts a leakage current path between the source and drain regions, i.e., the punch-through effect current flow. Based on embodiments herein, any potential punch-through current ($I_{punch-through}$) is reduced and/or substantially eliminated as a result of the REO layers 810a, 810b between the source/drain regions.

Further an arrow with the reference "$I_{substrate}$" 1060, which depicts leakage current between the source/drain regions and the substrate 205. This junction leakage current flow is reduced and/or substantially eliminated as a result of the REO layers 810a, 810b between the source/drain regions and the substrate 205. The $I_{punch-through}$ 1050 represent leakage current during the OFF state of the device 200. The $I_{substrate}$ 1060 represents the leakage current between the S/D regions and the substrate 205 (junction leakage current) during either the ON or OFF state of the device 200. The presence of the REO layers 810a, 810b do not interfere with the drive current of the fin 230, however, the REO layers 810a, 810b reduces or substantially eliminates the $I_{punch-through}$ 1050 leakage current during the OFF state and/or ON state of the device 200.

Figure 11:
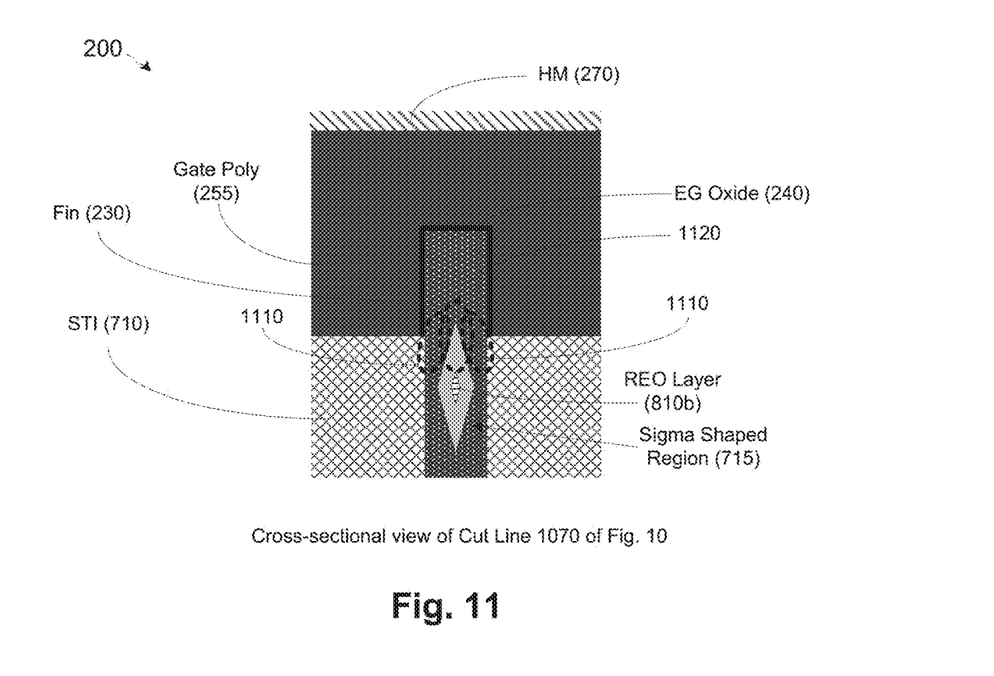
FIG. 11 illustrates a stylized depiction of a cross-section view that is perpendicular to the cross-sectional view of FIG. 10, in accordance with embodiments herein.

Turning now to FIG. 11, a stylized depiction of a cross-section view that is perpendicular to the cross-sectional view of FIG. 10, in accordance with embodiments herein is illustrated. Referring simultaneously to FIGS. 10 and 11, the cross-sectional depiction of FIG. 11 is a view relative to the cut-line 1070 of FIG. 10. FIG. 11 depicts the fin 230 surrounded by the EG oxide layer 240. The gate poly region 255 surrounds the EG oxide layer 240 in the manner depicted in FIG. 11. FIG. 11 also displays the sigma region 715, which is a side view of the recess region 610b of FIG. 6. The sigma region 715 is surrounded on both sides by the STI region 710. The portion of the sigma region 715 shown in FIG. 11 comprises the REO layer 810b.

Referring simultaneously to FIGS. 10 and 11, the main leakage path during the OFF state of the device 200 is from the center of the fin 230, generally encompassed by the reference circle 1120. By providing the REO layers 810a, 810b, the center fin region 1120 is partially isolated. This isolation causes $I_{punch-through}$ to be reduced or substantially eliminated as compared to a case where the REO layers 810a, 810b would not be present. That is, the presence of the REO oxide features 810a, 810b provides for reducing or substantially eliminating any current in the $I_{punch-through}$ 1050 leakage path, thereby reducing or substantially eliminating source region to drain region current leakage.

During the ON state of the device, 200, the primary drive current is provided by the fin regions enclosed by the references circles 1110. The silicon materials in this portion (i.e., the circles 1110) were not replaced by REO oxide material due to the shape of the sigma-shaped REO features 810a, 810b. Therefore, the drive current during the ON state is not affected by the REO features 810a, 810b due to their sigma shape. Despite not interfering with the drive current during the ON state of the device 200, the presence of the REO features 810a, 810b provides for reducing or substantially eliminating the leakage current represented by the $I_{substrate}$ 1060 leakage path during either the ON or OFF states of the device 200. In other words, because of the sigma shape of the REO features 810a, 810b, the drive current is preserved, but the leakage current (i.e., $I_{substrate}$ 1060) between the S/D regions and the substrate is reduced or substantially eliminated in either the ON state or the OFF state of the device 200. Further processing known to those skilled in the art may be performed to complete forming the device 200.

Figure 12:
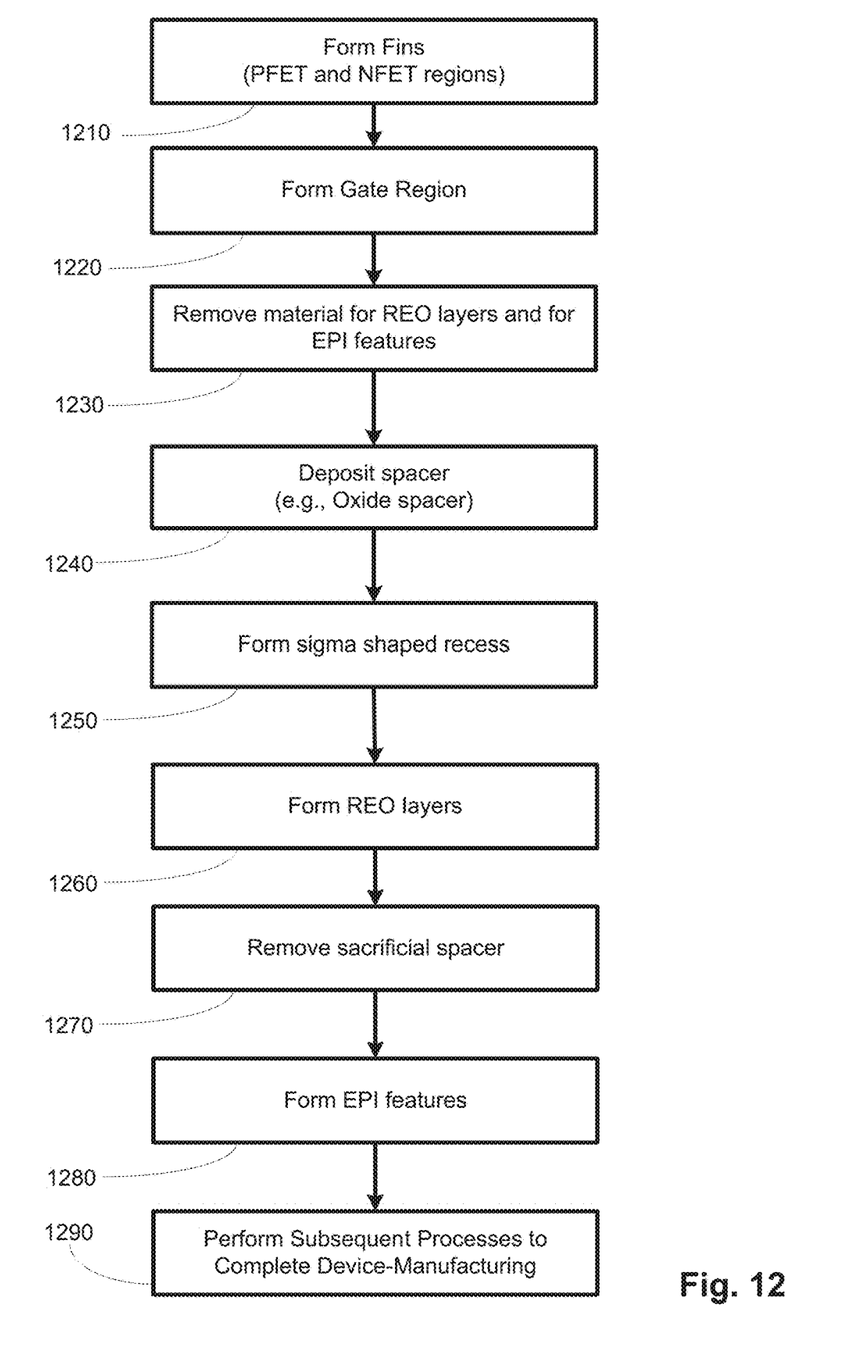
FIG. 12 illustrates a flowchart depiction of the method for forming a device comprising a REO layer below EPI features for reducing leakage current, in accordance with embodiments herein.

Turning now to FIG. 12, a flowchart depiction of the method for forming a device comprising a REO layer below EPI features for reducing leakage current, in accordance with embodiments herein is illustrated. A plurality of fins are formed on a substrate, including PFET and NFET fins (at 1210). For ease of discussion, only one fin is described, however, those skilled in the art having benefit of the present disclosure would appreciate that embodiments described herein may be applied to a plurality of fins, but PFET and NFET fins.

A gate region is formed over a fin (at 1220), as exemplified in FIG. 2. Subsequently, a portion of silicon material from S/D fin regions may be removed for forming REO layers and EPI features (at 1230), as exemplified in FIG. 3. A spacer deposition process may then be implemented to deposit a spacer (e.g., oxide spacer) (at 1240), as exemplified in FIG. 4.

A sigma recess process may then be performed (at 1250). The sigma recess process may comprise a plurality of steps. For example, horizontal portions of the spacer of block 1240 may be removed (as exemplified in FIG. 5). Subsequently, a plurality of recess regions may be formed below the fin that is below the gate region (as exemplified in FIG. 6). In some embodiments, the recess regions are formed in a sigma shape, while in other embodiments, other shapes with angled sidewalls may be formed. Forming the sigma recess may comprise forming recess regions below the S/D regions, wherein the recess regions comprise slanted sidewalls.

Subsequently, an REO layer deposition process is performed (at 1260), as exemplified in FIG. 8. The REO deposition process provides for filling the sigma recess space, including a portion of the region below the fin in the gate region. The sacrificial spacer may then be removed (at 1270), as exemplified in FIG. 9.

EPI features may then be formed on the S/D regions (at 1280), as exemplified in FIG. 10. The EPI features may be formed on the REO oxide layer and/or on silicon material from the side portions of the fin in the gate region. The REO layer and the EPI features provide for forming an S/D region for the gate region wherein a reduction of leakage current may be achieved. For example, the source region to drain region leakage current (i.e., the punch-through leakage current) may be reduced as a result of the structure and process provided by embodiments herein. Further, as another example, the S/D region to substrate leakage current (i.e., the substrate leakage current) may also be reduced without interfering with the drive current, as a result of the structure and process provided by embodiments herein. Further processing, e.g., poly-pull, gate metallization, etc. may be performed to complete forming the transistor device in accordance with embodiments herein.

Figure 13:
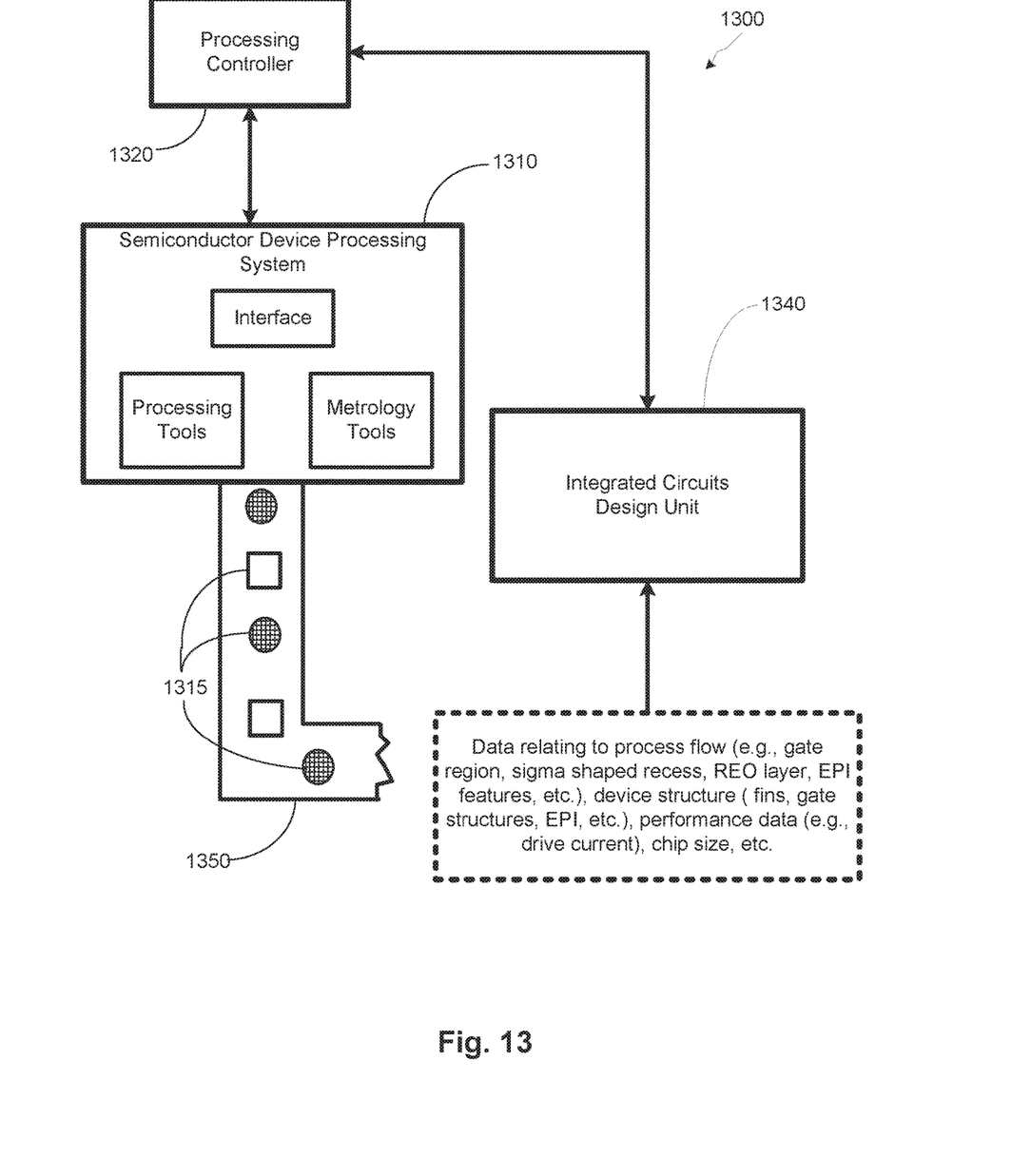
FIG. 13 a stylized depiction of a system for fabricating a semiconductor device comprising an integrated circuit, in accordance with embodiments herein.

Turning now to FIG. 13, a stylized depiction of a system for fabricating a semiconductor device comprising an integrated circuit, in accordance with embodiments herein, is illustrated. The system 1300 provides for forming a sigma recess, depositing an REO material in the sigma recess, and forming EPI regions above the REO material. The system 1300 of FIG. 13 may comprise a semiconductor device processing system 1310 and a design unit 1340. The semiconductor device processing system 1310 may manufacture integrated circuit devices based upon one or more designs provided by the design unit 1340.

The semiconductor device processing system 1310 may comprise various processing stations, such as etch process stations, photolithography process stations, REO deposition process stations, CMP process stations, Epitaxy (EPI) process stations, etc. One or more of the processing steps performed by the processing system 1310 may be controlled by the processing controller 1320. The processing controller 1320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1310 may produce integrated circuits on a medium, such as silicon wafers. More particularly, the semiconductor device processing system 1310 produce integrated circuits having finFET devices that comprise sigma recess regions that are filled with REO material, on which EPI features may be formed, as described above.

The production of integrated circuits by the device processing system 1310 may be based upon the circuit designs provided by the integrated circuits design unit 1340. The processing system 1310 may provide processed integrated circuits/devices 1315 on a transport mechanism 1350, such as a conveyor system. In some embodiments, the conveyor system may be sophisticated clean room transport systems that are capable of transporting semiconductor wafers. In one embodiment, the semiconductor device processing system 1310 may comprise a plurality of processing steps to perform sigma recess regions, filling them with an REO material, and forming EPI features on the REO material, as described above.

In some embodiments, the items labeled "1315" may represent individual wafers, and in other embodiments, the items 1315 may represent a group of semiconductor wafers, e.g., a "lot" of semiconductor wafers. The integrated circuit or device 1315 may be a transistor, a capacitor, a resistor, a memory cell, a processor, and/or the like.

The integrated circuit design unit 1340 of the system 1300 is capable of providing a circuit design that may be manufactured by the semiconductor processing system 1310. The integrated circuit design unit 1340 may be capable of determining the number of devices (e.g., processors, memory devices, etc.) to place in a device package, type of EPI features, growth of the EPI features from the fin sidewalls, as well as from the surface of the REO layer . . . . The integrated circuit design unit 1340 may also determine the height of the fins, the size of the fin channels, etc. Based upon such details of the devices, the integrated circuit design unit 1340 may determine specifications of the finFETs that are to be manufactured. Based upon these specifications, the integrated circuit design unit 1340 may provide data for manufacturing a semiconductor device having the EPI features provided by embodiments herein.

The system 1300 may be capable of performing analysis and manufacturing of various products involving various technologies. For example, the system 1300 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a fin on a semiconductor substrate;
   forming, over said fin, a gate region;
   forming, in a source region and a drain region adjacent bottom portions of said fin, a first recess cavity in said source region and a second recess cavity in said drain region, said first and second recess cavities comprising sidewalls formed in an angle relative to a vertical axis, wherein portions of said first and second recess cavities extend below said fin;
   forming, in said first recess cavity, a first rare earth oxide (REO) layer and in said second recess cavity, a second REO layer;
   forming a first epitaxial (EPI) feature on said first REO layer such that a bottom of said first EPI feature is in contact with a top of said first REO layer; and
   forming a second EPI feature on said second REO layer such that a bottom of said second EPI feature is in contact with a top of said second REO layer.

2. The method of claim 1, further comprising:
   removing a portion of a substrate material in said source region for forming said first recess cavity; and
   removing a portion of a substrate material in said drain region for forming said second recess cavity.

3. The method of claim 2, wherein:
   forming said first EPI feature comprises growing said an EPI structure from at least one of the surface of said first rare earth oxide layer, and a portion of the fin adjacent said source region; and
   forming said second EPI feature comprises growing said an EPI structure from at least one of the surface of said second rare earth oxide layer, and a portion of the fin adjacent said drain region.

4. The method of claim 2, wherein forming said first and second rare earth oxide layers comprises forming said first and second rare earth oxide layers to a height sufficient to substantially prevent current leakage flow from said first and second EPI features to said semiconductor substrate.

5. The method of claim 1, wherein forming said first and second recess cavities comprises forming a sigma shaped cavity, wherein said sigma shaped cavity extends below said fin.

6. The method of claim 5, wherein forming said sigma shaped cavity comprises performing a tetramethylammonium hydroxide (TMAH) etch process based on crystal Si-(111) material.

7. The method of claim 5, wherein forming said first and second rare earth oxide layers comprises depositing a rare earth oxide material into said sigma shaped cavity.

8. The method of claim 1, wherein forming said first and second rare earth oxide layers comprises reducing a substrate material area between said fin and said semiconductor substrate by replacing said substrate material area with a rare earth oxide material for reducing at least one of leakage current flow between said drain region and said source region below said fin, or leakage current flow between said source/drain regions and said semiconductor substrate.

9. The method of claim 1, wherein forming said first and second rare earth oxide layers comprises:
   forming a spacer about said gate region;
   forming a sigma shaped recess for forming said first and second recess cavities;
   depositing a rare earth oxide material into said sigma shaped cavity; and
   removing said spacer after forming said first and second rare earth oxide layers.

10. A method, comprising:
    forming, on a semiconductor substrate, a fin adjacent a source region and a drain region;
    forming a gate region over said fin;
    forming a sigma shaped cavity comprising a first recess cavity in said source region and a second recess cavity in said drain region;
    depositing a rare earth oxide (REO) material into said sigma shaped cavity forming a first REO layer in said first recess cavity and a second REO layer in said second recess cavity;
    forming a first epitaxial (EPI) feature above said first REO layer such that a bottom of said first EPI feature is in contact with a top of said first REO layer; and forming a second EPI feature above said second REO layer such that a bottom of said second EPI feature is in contact with a top of said second REO layer.

11. The method of claim 10, wherein forming said sigma shaped cavity comprising forming said sigma shaped cavity such that said first and second recess cavities extend below said fin.

12. The method of claim 10, wherein forming said sigma shaped cavity comprising performing a tetramethylammonium hydroxide (TMAH) etch process to form sidewalls formed in an angle relative to a vertical axis in said first and second recess cavities.

13. The method of claim 10, wherein forming said first and second REO layers comprises reducing a substrate material area between said fin and said semiconductor substrate for reducing a leakage current flow between said drain region and said source region below said fin.

14. The method of claim 10, wherein
forming said first EPI feature comprises growing said an EPI structure from at least one of the surface of said first REO layer, and a portion of the fin adjacent said source region; and
forming said second EPI feature comprises growing said an EPI structure from at least one of the surface of said second REO layer, and a portion of the fin adjacent said drain region.

15. The method of claim 10, wherein forming said first and second REO oxide layers comprises depositing at least one of gadolinium oxide, erbium oxide, lanthanum oxide, gadolinium-doped aluminum-zinc oxide (Gd-AZO) into said sigma shaped cavity.

\* \* \* \* \*